United States Patent [19]
Lau et al.

[11] Patent Number: 6,057,601
[45] Date of Patent: May 2, 2000

[54] HEAT SPREADER WITH A PLACEMENT RECESS AND BOTTOM SAW-TEETH FOR CONNECTION TO GROUND PLANES ON A THIN TWO-SIDED SINGLE-CORE BGA SUBSTRATE

[75] Inventors: John H. Lau, Palo Alto, Calif.; Tzyy Jang Tseng, Hsinchu; Chen-Hua Cheng, Taoyuan Hsien, both of Taiwan

[73] Assignee: Express Packaging Systems, Inc., Palo Alto, Calif.

[21] Appl. No.: 09/200,691

[22] Filed: Nov. 27, 1998

[51] Int. Cl.[7] .................................................. H01L 23/48
[52] U.S. Cl. ...................... 257/738; 257/690; 257/706; 257/730; 257/784
[58] Field of Search .................................... 257/731, 784, 257/676, 690, 691, 692, 738, 687, 683, 706, 717, 718, 720, 730, 737

[56] References Cited

U.S. PATENT DOCUMENTS

| | | | |
|---|---|---|---|
| 5,397,921 | 3/1995 | Karnezos | 257/779 |
| 5,541,450 | 7/1996 | Jones et al. | 257/697 |
| 5,729,050 | 3/1998 | Kim | 257/667 |
| 5,819,398 | 10/1998 | Wakefield | 257/737 |
| 5,825,084 | 10/1998 | Lau et al. | 257/700 |
| 5,834,839 | 11/1998 | Mertol | 257/704 |
| 5,895,973 | 4/1999 | Fessenden | 257/13 |

OTHER PUBLICATIONS

Lau et al, Electrical Design of a Cost–Effective Plastic BGA Package, IEEE Part B, vol.21, No.1, Feb. 1998.

*Primary Examiner*—Sheila V. Clark
*Assistant Examiner*—H. D. Tran
*Attorney, Agent, or Firm*—Bo-In Lin

[57] ABSTRACT

The present invention discloses a new semiconductor ball grid array package for integrated circuits which have input and output counts higher than 250. The speed and performance characteristics of the semiconductor device contained in the package assembly are optimized while the packaging structure is simplified by utilizing only one dielectric layer and regular printed circuit board fabrication process. The complexities and higher cost for production of a multiple layer substrate for high-density interconnection configuration are thus resolved. The improved package assembly is achieved by implementing a segmented ring on one side of a substrate and a split plane on the other side thus forming a single layer substrate structure. The edges of the substrate are coated with metal layer to provide interlayer connections. The package assembly applies a cavity down configuration with an integrated heat spreader attached. The IC wire bonds within the cavity are sealed with an organic encapsulant. In addition to the benefits of high performance low cost, the improved circuit structure and package layout provide flexibility allowing higher degree of freedom for selecting the location and number of input and output signal lines and connections to the ground and power planes from the semiconductor device.

20 Claims, 8 Drawing Sheets

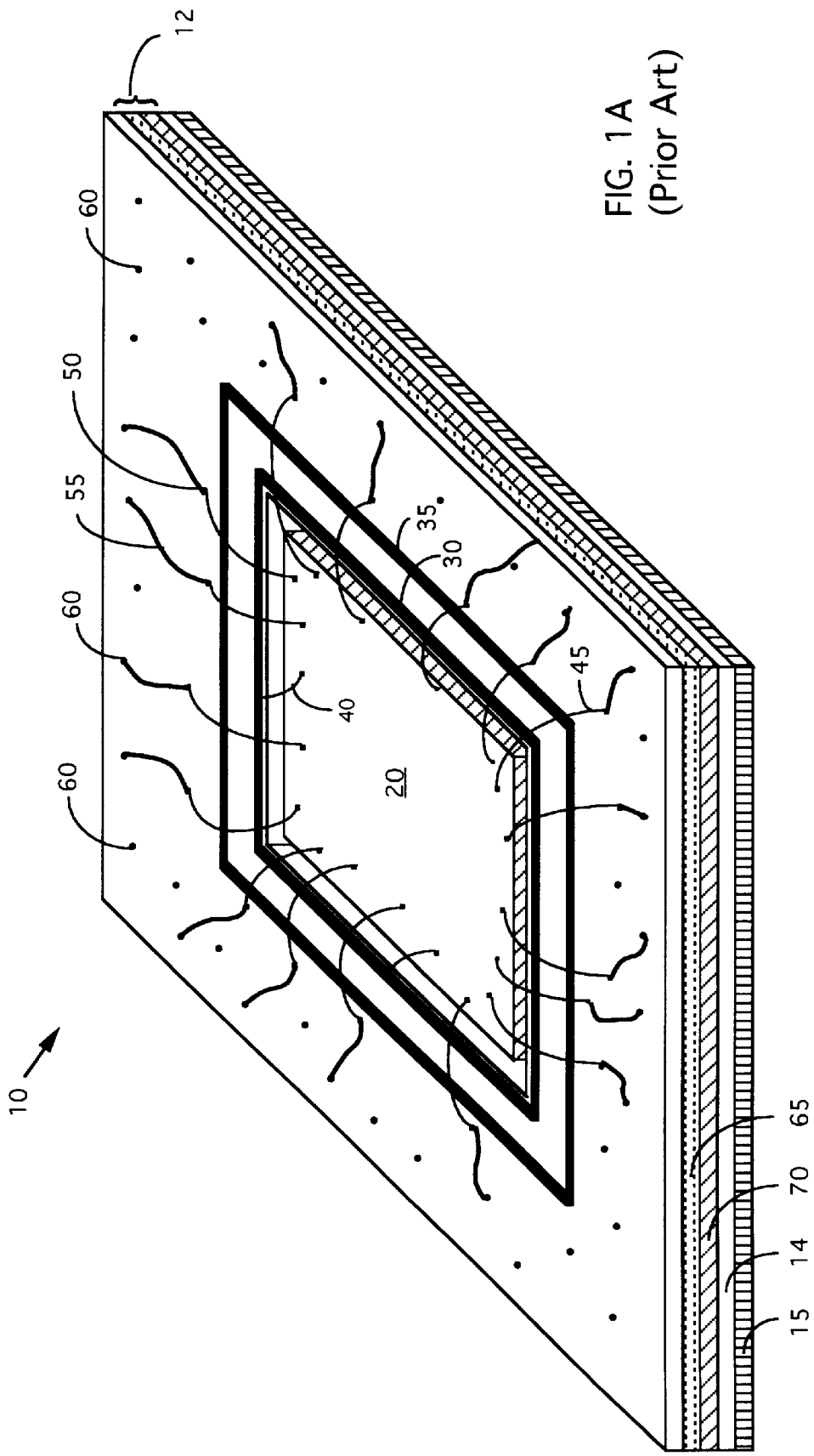

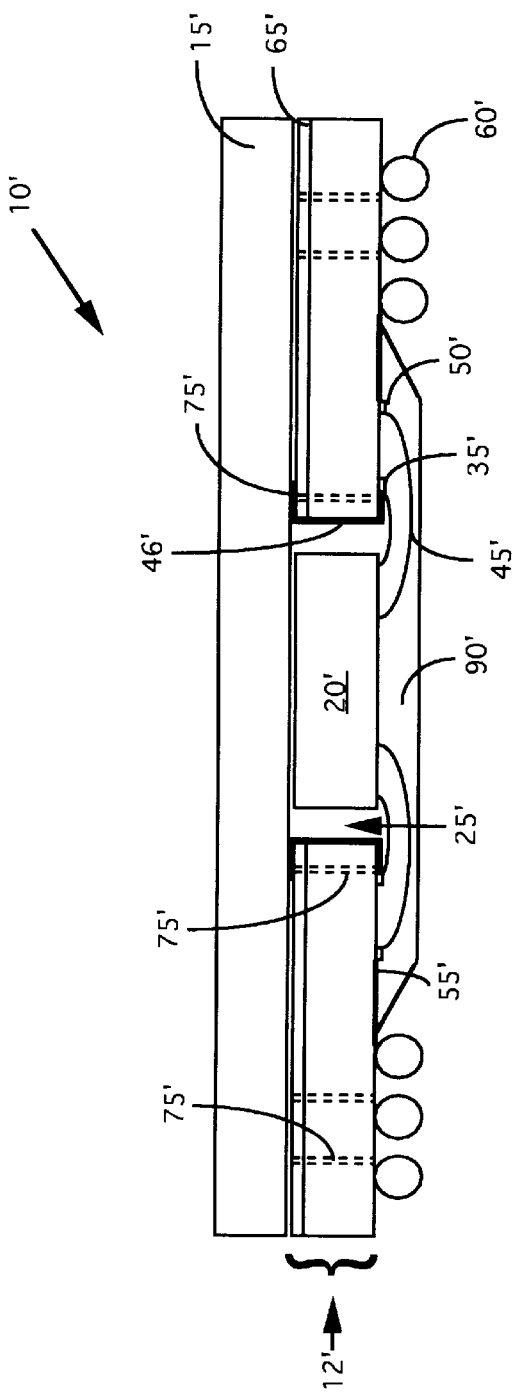
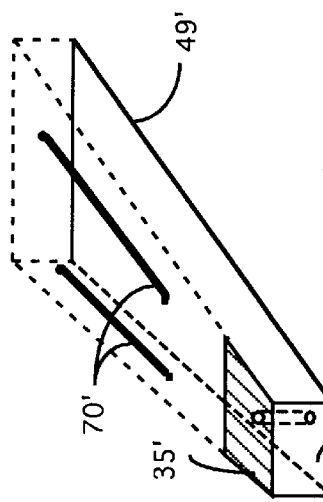
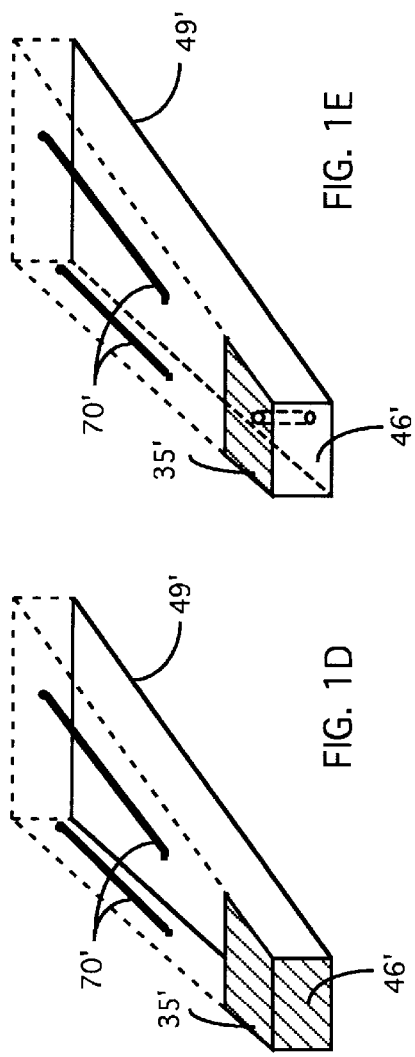
FIG. 1C
FIG. 1D
FIG. 1E

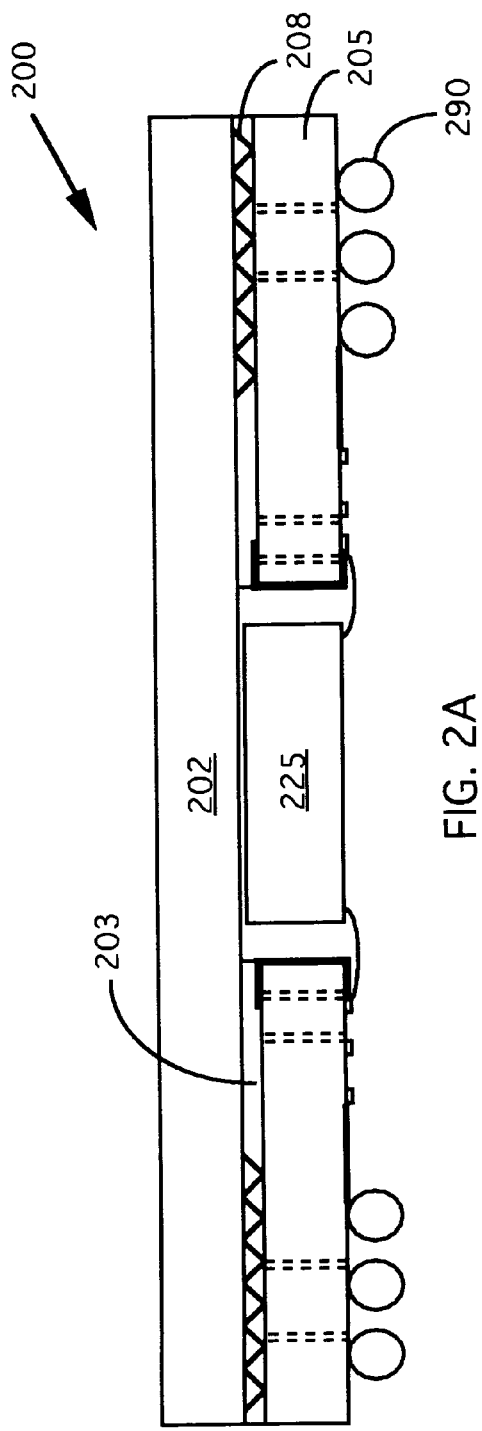
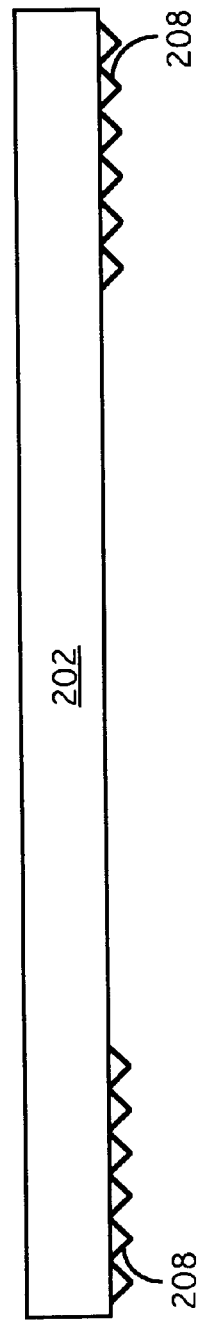

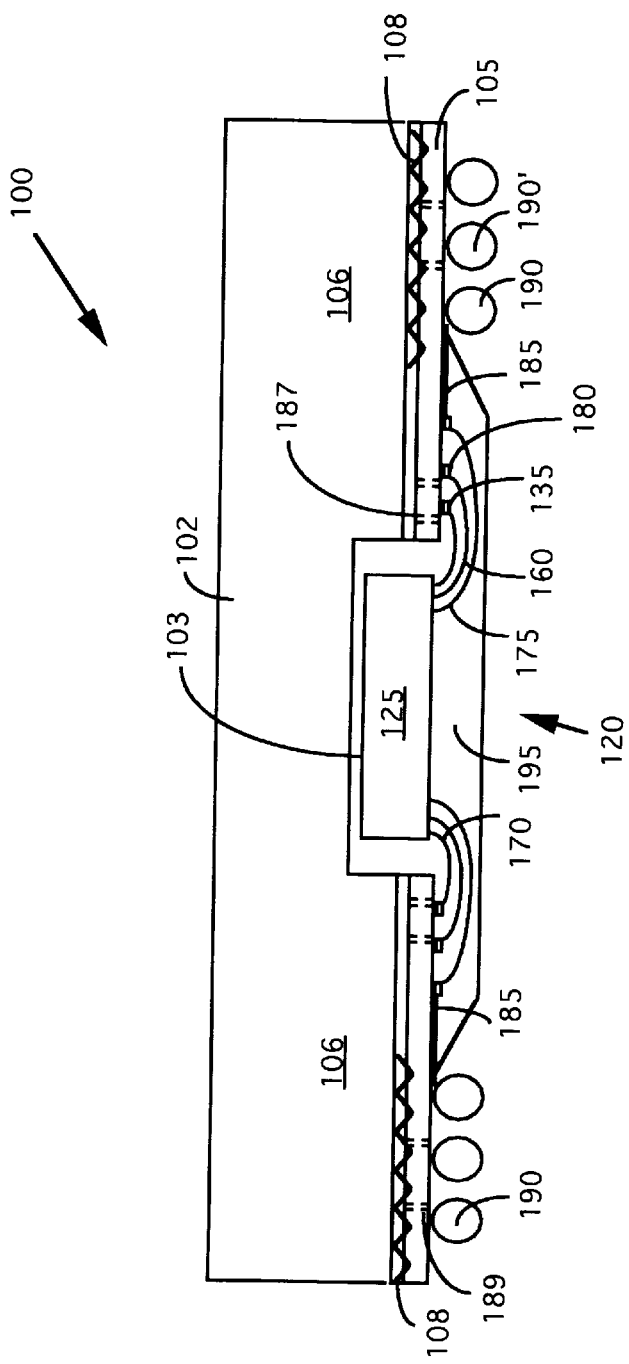
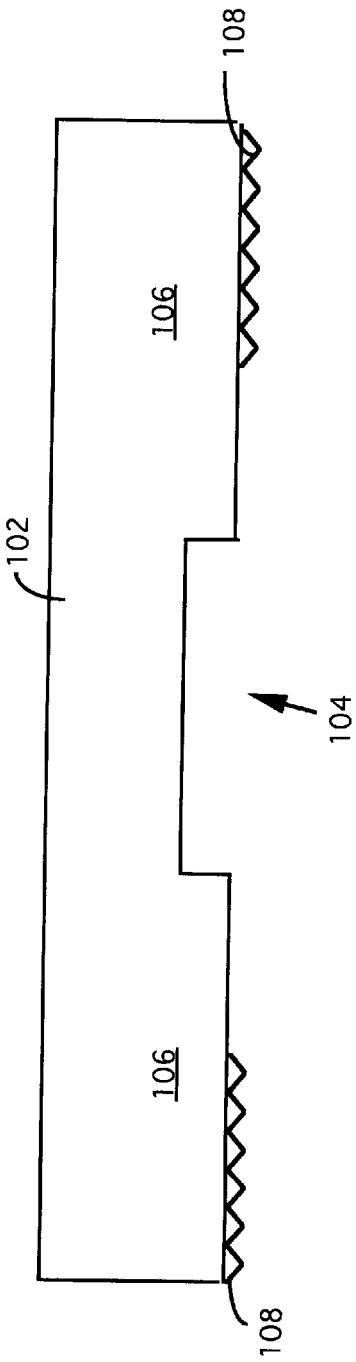
FIG. 3A
FIG. 3B

HEAT SPREADER WITH A PLACEMENT RECESS AND BOTTOM SAW-TEETH FOR CONNECTION TO GROUND PLANES ON A THIN TWO-SIDED SINGLE-CORE BGA SUBSTRATE

BACKGROUND OF THE INVENTION

1. Field of the Invention

This invention relates generally to the electronic package. More particularly, this invention relates to a novel configuration of a package assembly which includes a supporting heat spreader provided with a plurality of saw-teeth to penetrate an adhesive layer covering a plurality of ground planes. These ground contact planes are formed on a backside of a substrate supporting a semiconductor device such that the heat spreader can function as a ground terminal for the semiconductor device. In another preferred embodiment, the heat spreader includes a semiconductor chip placement recess to dispose a semiconductor chip therein thus allowing a substrate to be fabricated with a thickness which is significantly reduced. Again, the heat spreader is made with bottom surface having saw-teeth to contact the ground planes disposed on the backside of the substrate. Improvements in electrical and thermal performance are achieved.

2. Description of the Prior Art

Further improvement of the performance of a packaged integrated circuit (IC) device by employing a ball-grid array (BGA) configuration is limited by the thickness of the substrate. Generally the performance of a BGA package is improved with a substrate of reduced thickness. However, there are several limitations prevent the thickness of the substrate to be further reduced. Conventionally, substrate of multiple layers is employed. The performance of such packages can be improved by reducing the thickness of these layers. However, for a multiple layer substrate, more complicate manufacture processes are required which may involve the processes of punching through holes, the placement of metal traces and wires to different layers, and the arrangement of connecting different signals to wires in different layer all become more complicate. Production costs for packaging is increased while productivity and yield are decreased due to these complexities. On the other hand, the high performance requirements of modern IC devices impose high density of interconnections and large number of input and output signal lines for the IC devices to be packaged into ever-smaller volume. All these design and performance considerations add to the difficulties in attempting to lower the production costs, which are increasing due to the use of a multiple-layer substrate with complicate structures.

For general background information, modern semiconductor packages typically includes a substrate to mount an integrated circuit (IC) chip thereon. The areas on the surface of the substrate next to the mounted chip are then applied to redistribute or fan out the input and output signals from the IC device. The substrate can be a metal, e.g., a copper lead-frame, a laminated epoxy glass, or a ceramic plate. Polymeric encapsulants or plastic molding compounds are used to seal off the device. As the dock speed increases to several hundred megahertz or higher, the speed of signal redistribution impacted by the packaging configurations often becomes a limiting design factor of device performance. Conventional electrical circuit design and packaging technology can no longer satisfy the high-speed signal transmission requirements. For high-speed high performance devices, in order to overcome these performance limitations, there is a demand for improved circuit design and packaging techniques where the signal redistribution processes can be more rapidly and reliably carried out A technique to simplify the manufacture process and to improve the signal redistribution from the semiconductor device is to form two rings, i.e., a power ring and a ground ring, for wire connection, as that shown in FIGS. 1A and 1B. A perspective view and a cross sectional view for a conventional electronic package 10 for packaging a semiconductor device 20 are shown in FIGS. 1A and 1B respectively. A substrate 12 is attached to a heat sink plate 15 via an adhesive layer 14 to support a semiconductor device 20 placed in a cut-off section 25 disposed in a center portion of the substrate 12. Two rings, i.e., a ground ring 30 and a power ring 35, are formed on the substrate 12 surrounding the semiconductor device 20 disposed in the cut-off section 25. A plurality of conductive wires 40 are interconnected between the semiconductor device 20 and the ground ring 30 and the power ring 35 for connection to a ground voltage or a high or operating voltage. A plurality of signal wires 45 are connected to a corresponding contact pad 50 disposed on the substrate 12 and are further connected to a solder ball 60 via a metal trace 55 formed on the top surface of the substrate 12. The ground ring 30 and the power ring 35 are corrected to a ground plane 65 and a power plane 70 respectively formed beneath the bottom surface of the substrate 12 through a ground via-connection via 75 and a power via connection 80 respectively punched through the substrate 12. The ground plane 65 and the power plane 70 are then interconnected to the balls 60 through another set of via-connections 85 disposed near the peripheral of the substrate 12.

The technique as discussed above is to achieve high performance by forming a multiple layer substrate, including the ground plane 65 and the power plane 70, to increase the interconnection density with higher number of signal traces. Finer metal traces are then applied with smaller spacing between them. Additional through-holes, e.g., via connections 75, 80 and 85, are required to be formed on the substrate for connecting the traces to several layers. The processes required to make a substrate of multiple layer structure and forming a plurality of via-connections cause significant increase in complexity of manufacturing processes and higher production cost for the IC packages. Additionally, the thickness of the substrate 12 as shown in FIG. 1B can not be reduced. It is due to a simple reason that the solder balls 60 are provided in the package to contact the external electrical contacts. The bottom surface of the solder balls 60 must be lower than the bottom of the encapsulate cap 90. The thickness of the semiconductor chip 20 is about 10–15 mils. The encapsulate-cap 90 extends 5 to 10 mils below the chip 20. The thickness of the substrate 12 should be at least 15 to 20 mils, otherwise the bottom of the solder balls 60, which generally have a height of 15 mils, would not be lower than the encapsulate cap 90. Therefore, reduction in substrate thickness, e.g., forming a substrate less than 10 mils, would then causes the encapsulate cap 90 to stick out below the bottom of the solder balls 60. The balls 60 cannot provide the function for external connection to the circuits on the printed circuit board (PCB) for next level integration . This is due to the geometry that the encapsulate 90 now interferes and prevents the solder balls 60 to physically contact the circuits on the printed circuit board (PCB) (not shown) which is to be placed underneath the substrate 12.

Referring now to FIG. 1C for a cross sectional view of another prior art substrate 12' manufactured with a split-wrap-around (SWA) connection configuration attached to a heat spreader 15'. The substrate 12' includes a central cut-off section 25'. The cutoff section 25' provides an open space to allow the bonding wires to interconnect a semiconductor device 20' and the ground and power segments and bonding pads disposed on the downward facing surface of the substrate 12'. Referring also to FIGS. 1D and 1E, along the top surface near the edges of the cut-off portion 25', the substrate 12' has a plurality of mutually insulated contact-pad segments 35'. The mutually insulated contact pad segments 35' are formed to surround the edges of the central cutoff section 25'. Each of these mutually insulated contact-pad segments 35' is connected to a split-wrap-around (SWA) contact edge surface 46'. The SWA contact is formed to wrap around the edge of the cut-off section 25' for connecting the mutually insulated contact-pad segments 35' to a corresponding split plane 19' formed on the bottom surface (referring to FIGS. 1F and 1G). The mutually insulated contact-pad segments 35' and the SWA contact edge surface 46' are preferably in metal films of copper, gold, nickel or other types of conductive metals or combinations of these metals. On the bottom surface of the substrate 12', there are also signal coplanar signal strips 54' formed in the gaps 48' between the coplanar power and ground planes 49. In FIG. 4E, other than the split-wrap-around connection means 46' there are also through hole connection 75' for connecting the contact segments 35' to the split power and ground planes 49' disposed on the bottom surface. This single core double-side substrate provides superior performance and low cost packaging configuration. However, a substrate of greater thickness must be employed. Furthermore, the heat spreader is not connected to provide a ground potential. Further improvements of electric and thermal performance can not be easily achieved due to a thickness requirement of the substrate and a more stable ground potential is not yet provided because the substrate is not electrically connected to the heat spreader.

Therefore, a need still exits in the art to provide a new package assembly with improved electrical performance by reducing the thickness of a substrate and providing more stable ground potential by connecting the substrate to the heat spreader. This new package assembly should improve the performance of the packaged integrated circuit (IC) devices and reduce the production cost of the electronic package with simplified layer structure. It is desirable that the novel configuration of circuit connections employed in the electronic package assembly of this invention can provide less complicate manufacture method such that the production yields and product reliability are also improved. It is also desirable that the heat dissipation of the packaged IC devices can be improved.

SUMMARY OF THE PRESENT INVENTION

It is therefore an object of the present invention to provide a new semiconductor package assembly with novel structure, circuit connection configuration, and manufacture processes to produce a two-sided single-layer substrate of reduced thickness. A specially configured heat spreader is disclosed in this invention in order to overcome the aforementioned difficulties encountered in the prior art.

Specifically, it is an object of the present invention to provide a new semiconductor package assembly with novel configuration of circuit connection, and manufacture processes. A new two-sided, single-core substrate of reduced thickness is placed in a substrate placement recess of a heat spreader whereby an electronic package assembly with a single layer substrate of reduced thickness and improved performance can be provided.

Another object of the present invention is to provide a new semiconductor package assembly supported on a new heat spreader provided with a substrate placement recess. A new manufacture process is employed to fabricate a two-sided single-core substrate with novel structure, circuit connection. The IC chip disposed in the placement recess is supported on a substrate with reduce thickness such that performance of the integrated circuit is improved. Further improvement of performance is obtained by forming a plurality of saw-teeth on a bottom surface of the heat spreader to contact the ground planes to provide ground potential to the IC chip.

Another object of the present invention is to provide a new semiconductor package assembly supported on an improved heat spreader provided with a substrate placement recess. By placing the IC chip in the placement recess, the heat dissipation for the integrated circuit and the product reliability can be improved with the substrate now surrounded by a heat spreader with increased thickness. Electric performance is also improved by applying a simple method where the saw teeth on the bottom surface of the heat spreader are arranged to contact the ground planes connected to the ground terminals of the IC chip.

Briefly, in a preferred embodiment, the present invention comprises a semiconductor packaging assembly. The packaging assembly includes a heat spreader single with a novel configuration wherein a special semiconductor chip placement recess is provided to dispose the semiconductor chip therein. This specially packaging configuration allows the substrate to have a reduced thickness, e.g., a substrate less than 5 mils, when the placement recess has a depth of about 10 to 15 mils. A single-core double-sided printed circuit board substrate of reduced thickness is attached to the heat spreader. The semiconductor chip is placed in the recess with wires connected to contact segments provided on the substrate. Specifically, novel processing steps are applied to manufacture a plurality of mutually insulated contact-pad segments shaped as split ring employed for ground and power connections to the semiconductor device. Each of the mutually insulated contact-pad segments are further formed to be in electric contact with split planes via a split-wrap-around connections formed as a thin layer for wrapping around an edge surface cut off between the top and bottom surfaces of the substrate. Each of the split planes which is formed as a conductive layer on the bottom surface can be ether a power or ground split plane depending on the voltage level of the split contact-pad segments. Thus a two-sided single-core substrate provided with ground and power contact segment and split planes are formed. With the integrated circuit chip placed in the placement recess in the heat spreader, a central cutoff cavity is provided for connection access to the circuits on the semiconductor chip. The ball-grid-array (BGA) package assembly also includes a plurality of bonding pads formed on the substrate for connections to signal wires with metal traces connected to the solder balls disposed on the perimeter of the substrate. Furthermore, a plurality of through-hole vias are formed on the perimeter of the substrate for connecting the split power and split ground planes on the bottom surface to the solder balls thus forming a complete BGA package assembly. The substrate has a reduced thickness and simplified structure. The cost of production and the reliability of electrical connections are improved. A user is also provided with more flexibility to select a ground or power contact pads depending on the layout of signal input or output ports on the semiconductor device. Additionally, the heat spreader is formed with saw teeth on the bottom surface. The saw teeth penetrate the insulation layer on the backside of the substrate to contact the coplanar ground planes connected to the IC chip. A configuration provided by simple manufacture and packaging processes is available to provide a ground potential to the IC chip by electrically connecting to the heat spreader.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIGS. 1A and 1B show the perspective view and cross sectional view respectively for a prior art substrate with a ground ring, a power ring and a multiple layer structure;

FIGS. 1C to 1G show the cross sectional view, the side perspective views and the bottom view of a split-wrap-around (SWA) single-core double-side substrate according to a prior art invention;

FIGS. 2A and 2B shows the cross sectional views of an electronic package assembly and the heat spreader respectively provided with bottom saw teeth according to the configuration of this invention.

FIGS. 3A to 3B show cross sectional view of the semiconductor package assembly and the heat spreader provided with a chip placement recess and bottom saw teeth according to the configuration of this invention;

DETAILED DESCRIPTION OF THE PREFERRED EMBODIMENT

Figure 2C:
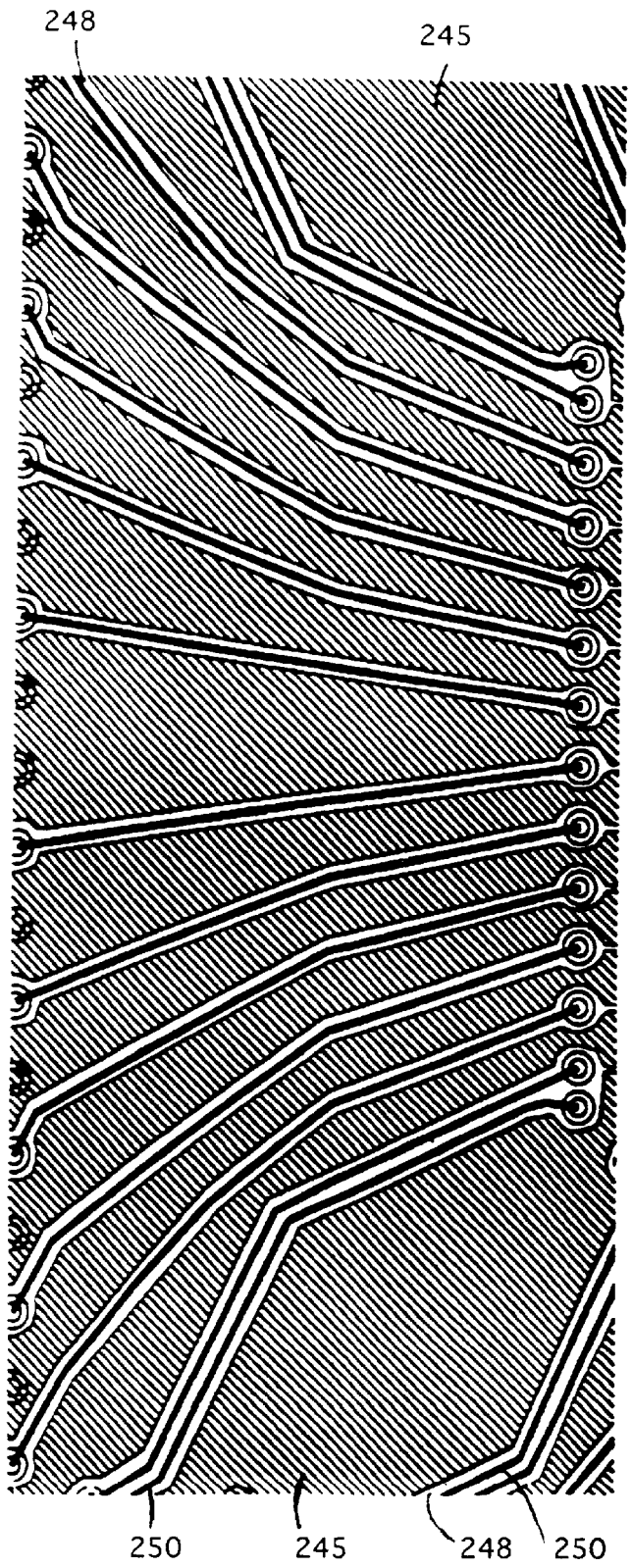
FIG. 2C shows the bottom view of the substrate of FIGS. 3A and 3B where coplanar ground and power planes and coplanar signal traces are formed with the ground planes in contact with the heat spreader through the saw-teeth disposed at the bottom surface of the heat spreader.

FIGS. 2A and 2B are cross sectional views of an electronic package assembly 200 for supporting and providing external contacts for an integrated circuit chip 225. The electronic package assembly 200 is supported on a heat spreader 202 which has a cross section as that shown in FIG. 2B. The heat spreader 202 of this assembly 200 is a flat spreader. The substrate 205 is a substrate of about the same thickness as a semiconductor chip 225 and has a cavity in the center for placement of the semiconductor chip 225. A plurality of saw-teeth 208 are formed on the bottom surface of the heat spreader 212 penetrate the adhesive layer and the heat conductive intermediate 203 to contact a plurality of coplanar ground planes 245 (see FIGS. 2C) formed on the back of the substrate 205. The heat spreader 202 provides a ground potential for the IC chip 225 via the saw-teeth 208 and the ground planes 245. Improvements of electric performance are achieved with this ground potential configuration.

The substrate 205 is supported on the heat spreader 202. The substrate 205 and the semiconductor chip 225 are attached to the heat spreader 202 via a heat conductive intermediate 203, e.g., a pre-preg or laminated pre-preg layer, disposed between the substrate 205 and the heat spreader 202 and between the chip 225 and the heat spreader 202. Because of the elevation difference, the balls 290 of the ball grid array (BGA), provided as external contacts, is situated at a lower elevation than the bonding wires and an encapsulation layer (not shown) encapsulating and protecting the semiconductor chip 225. The encapsulate cap covering and protecting the semiconductor chip 225 and the bonding wires would not interfere with the contacting balls 290 to function as external connecting points.

Figure 1B:
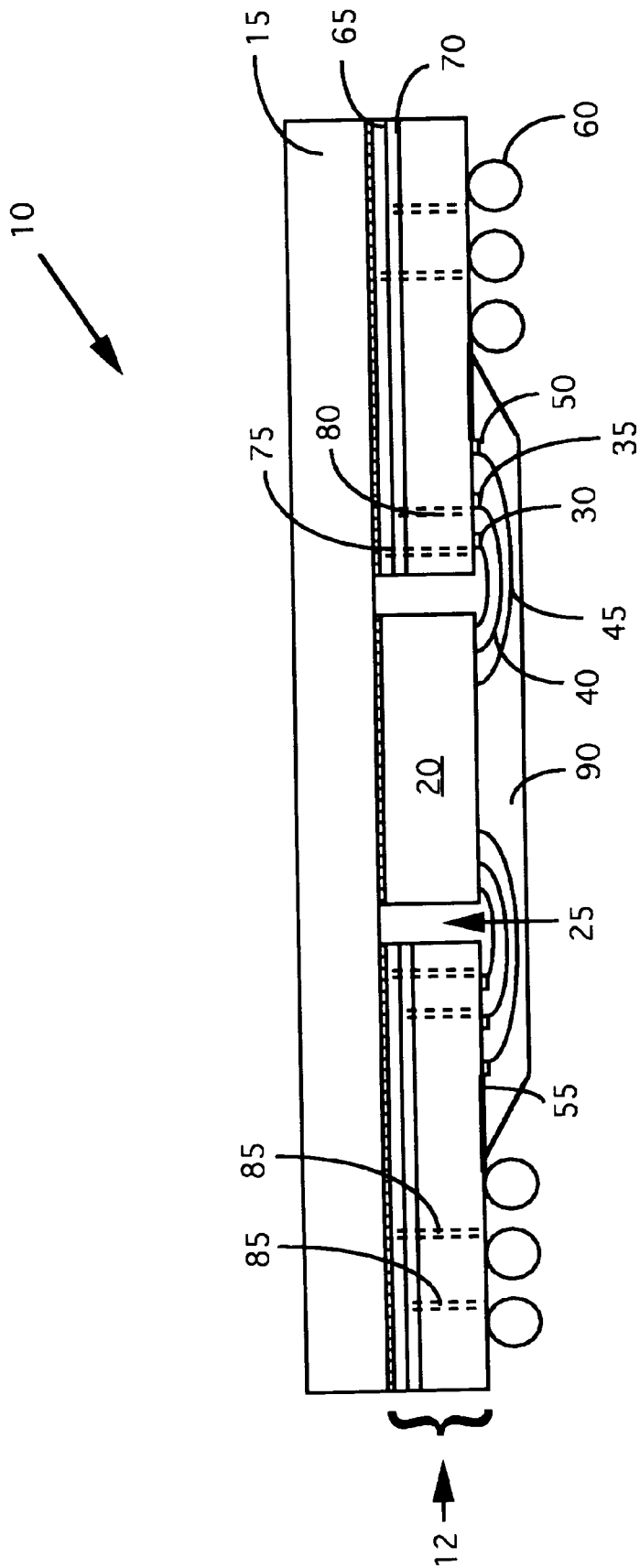
Figures 1F, 1G:
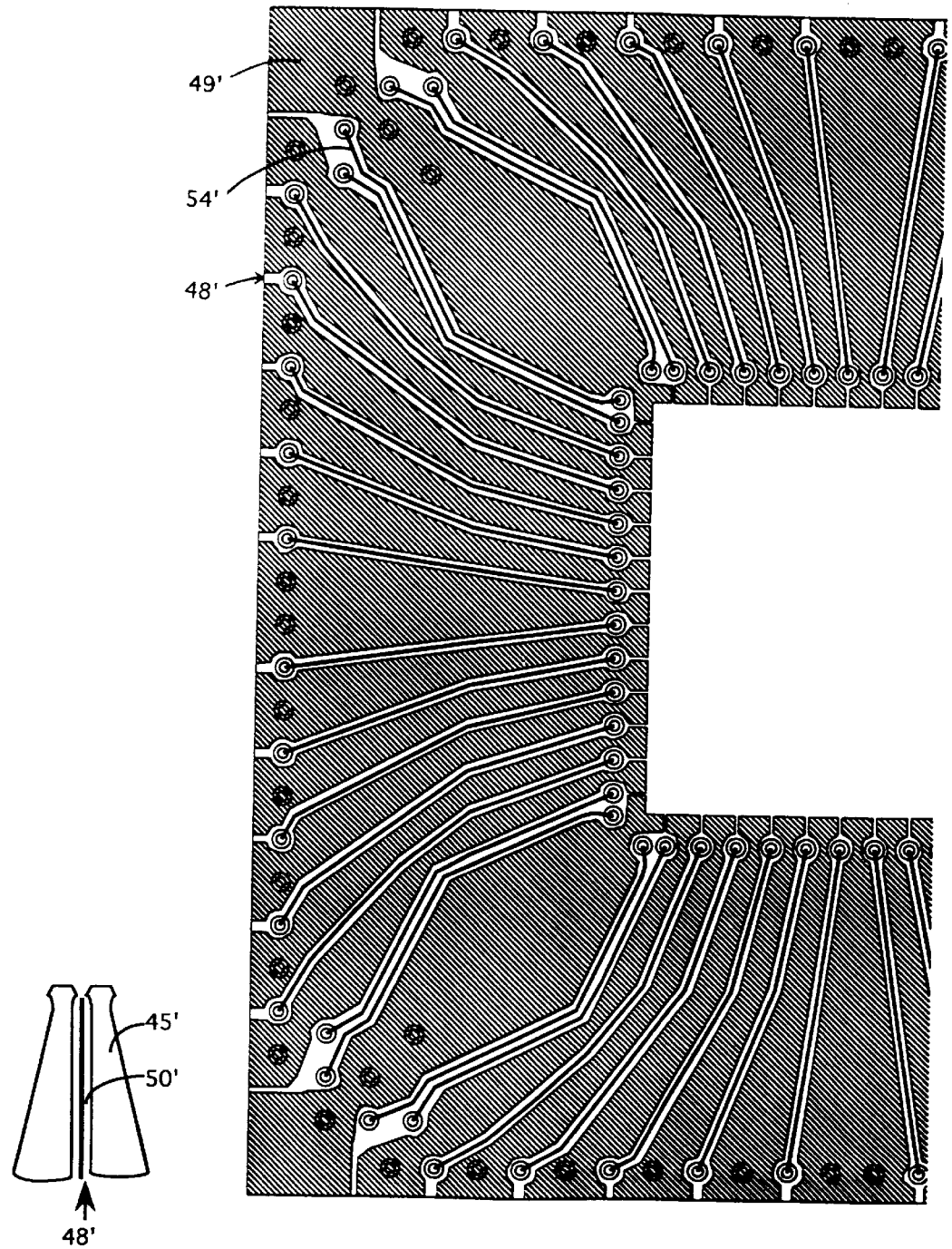

Forming on the bottom surface of the heat spreader 202 a plurality of saw-teeth 208 provides additional advantage of this invention. The sharp front-ends of the saw-teeth 208 penetrate the adhesive layer and the heat conductive intermediate 203 to contact a plurality of coplanar ground planes 245 (see FIG. 2C) formed on the back of the substrate 250. Similar to the bottom surface as that shown in FIG. 1F, there are coplanar signal traces 250 formed in the gaps 248 between the coplanar power and ground planes 245. The heat spreader 202 provides a ground potential for the IC chip 225 via the saw-teeth 208 and the ground planes 245. Improvements of electric performance are achieved with this ground potential configuration.

Figure 3C:
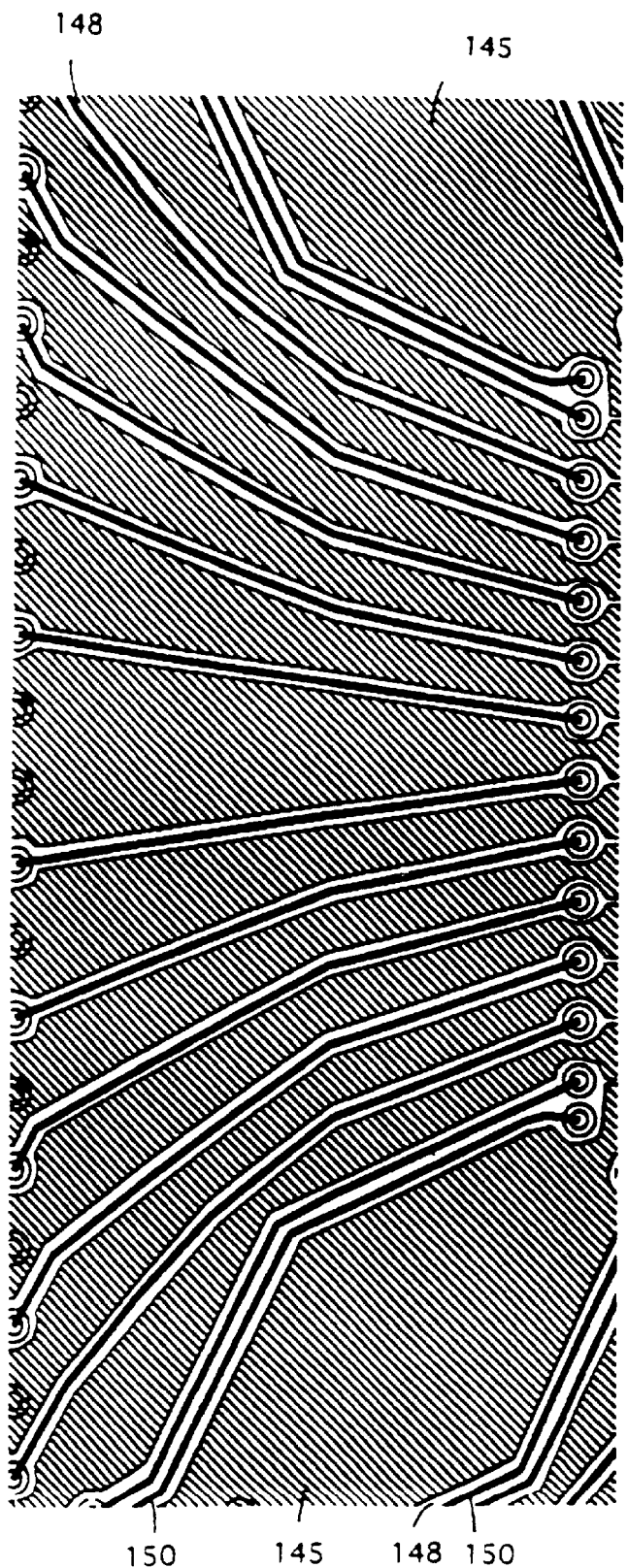
FIG. 3C shows the bottom view of the substrate of FIGS. 2A and 2B where coplanar ground and power planes and coplanar signal traces are formed with the ground planes in contact with the heat spreader through the saw-teeth disposed at the bottom surface of the side-walls.

Please refer to FIG. 3A for a cross sectional of an electronic package assembly 100 for supporting and providing external contacts for an integrated circuit chip 125. The electronic package assembly 100 is supported on a heat spreader 102 which has a cross section as that shown in FIG. 3B. The heat spreader 102 includes an integrated circuit (IC) chip placement recess 104 formed substantially in a central portion for placing a semiconductor IC chip 125 therein. The substrate 105 is supported on the heat spreader 102. The substrate 105 and the semiconductor chip 125 are attached to the heat spreader 102 via a heat conductive intermediate 103, e.g., a pre-preg or laminated pre-preg layer, disposed between the substrate 105 and the heat spreader 102 and between the chip 125 and the heat spreader 102. With the semiconductor device 125 now disposed in an IC chip placement recess 104, the substrate can now be provided with reduced thickness. An elevation difference is generated between the surface of the chip 125 and the bottom surface of the substrate 105. The bonding wires 160 and 170 are provided to connect the circuit on the semiconductor chip 125 to the connectors provided on the substrate 105. Because of the elevation difference, even with the substrate 105 of reduced thickness, the balls 190 of the ball grid array (BGA), provided as external contacts, is situated at a lower elevation than the bonding wires 160 and 170. An encapsulate cap 195 covering and protecting the bonding wires 160 would not interfere with the contacting balls 190 to function as external connecting points. By adjusting the depth of the placement recess 104 and the thickness of the side walls 106 of the heat spreader 102 surrounding the placement recess 104, the balls 190 can be arranged to have sufficient clearance. The balls 190 can firmly and securely contact the external circuit without being interfered by either the bonding wires or the encapsulate cap 195.

In addition to the benefit of reducing the substrate thickness, the heat spreader 102, with the electronic package assembly 100 arranged as that shown in FIGS. 3A and 3B, has another advantage. The IC chips 125 are now surrounded by the side-walls 106 composed of material of high heat conductivity, e.g., copper. Compare to a conventional arrangement, the semiconductor chip is surrounded by substrate, which is typically made of dielectric material, heat dissipation from the semiconductor chip 125 is now significantly enhanced. The side-walls 106 of the heat spreader 102 can be formed with thickness ranging from 15 to 30 mills. With an IC chip 125 having a typical thickness of around 15 mils, the substrate 105 can be formed with a thickness ranging from 1 to 10 mils depending on the applications and detail design of the package assembly. Compared to the substrate thickness of a conventional package assembly which is about the same as the IC chip 125, e.g., typically 15 mils, the substrate 105 of this invention can now be significantly reduced, e.g., a 50% to 90% reduction. Performance of the electronic package assembly of this invention can now be improved with substrate of reduced thickness when the IC chip 125 is placed in a placement recess 104 of the heat spreader 102.

Forming on the bottom surface of the heat spreader 102 a plurality of saw-teeth 108 provides additional advantage of this invention. The sharp front-ends of the saw-teeth 108 penetrate the adhesive layer and the heat conductive intermediate 103 to contact a plurality of coplanar ground planes 145 (see FIG. 3C) formed on the back of the substrate 105. Similar to the bottom surface as that shown in FIGS. 1F and 2C, there are coplanar signal traces 150 formed in the gaps 148 between the coplanar power and ground planes 145. The heat spreader 102 provides a ground potential for the IC chip 125 via the saw-teeth 108 and the ground planes 145. Improvements of electric performance are achieved with this ground potential configuration.

A new semiconductor package assembly with novel structure, circuit connection configuration, and manufacture processes is disclosed in this invention. The semiconductor package assembly employs a specially configured heat spreader with a chip placement recess to place a substrate of reduced thickness therein. The package assembly also includes a two-sided single-layer substrate to overcome the difficulties encountered in the prior art. On the two-sided, single-layer substrate, a plurality of mutually insulated contact-pad segments for power and ground connections are formed which are connected with split planes disposed on the bottom surface of the single layer substrate whereby a single layer substrate can be utilized. Improvements in device performance characteristics are achieved because of the reduced thickness of the substrate. Heat dissipation from a semiconductor IC chip is also enhanced because the chip is now surrounded by the side walls of the heat spreader which are made of materials with high conductivity coefficients. The mutually insulated contact-pad segments connecting to split ground and power planes allow a designer the flexibility to select the locations and the number of power and ground connections most suitable for packaging an IC device. Furthermore, the mutually insulated contact pad segments connected to split planes provide more space and flexibility to arrange single input and output wires for core logic and device circuit to achieve more optimal layout and package design. Additionally, in this new semiconductor package assembly with novel structure, circuit connection configuration formed on a two-sided single-layer substrate, the insulation between the contact pads and wires is improved and also, by arranging alternating ground and power contact pads, lower noises caused by coupling and interference are achieved.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering ill alternations and modifications as fall within the true spirit acid scope of the invention.

What is claimed is:

1. An electronic package assembly for containing and providing electrical contacts to a semiconductor device comprising:

a substrate including a chip placement area designated for disposing said semiconductor device, said substrate further including a first surface having a plurality of mutually insulated contact segments disposed near said chip area provided as ground and power contact pads for said semiconductor device;

a plurality of mutually insulated split planes, provided as ground and power split planes on a second surface of said substrate for said semiconductor device;

a plurality of connection means for electrically connecting each of said ground and power contact pads on said first surface to a corresponding mutually insulated ground and power contact pads on said first surface; and an electrically conductive heat spreader overlaying and attached to said second surface of said substrate via an adhesive layer wherein said heat spreader having sharp-edged connectors sticking out of said heat spreader and penetrating said adhesive layer wherein said sharp-edged connectors are prearranged for contacting said ground split planes on said second surface of said substrate for providing a ground potential for said semiconductor device and for conducting a heat generated by said semiconductor device to said heat spread therethrough.

2. The electronic package of claim 1 wherein:

said chip placement area constituting a cutoff cavity for placing said semiconductor device therein, said cutoff cavity including a plurality of cutoff edges on perimeters of said cutoff cavity extending from said first surface to said second surface;

said plurality of connection means further includes a plurality of split conductive strips wrapping around cutoff edges for connecting said power and ground contact pads on said first surface to said ground and power split planes on said second surface; and said sharp-edged connectors sticking out of said heat spreader are disposed on a surface area of said heat spreader facing said substrate surrounding said cutoff cavity.

3. The electronic package of claim 1 wherein:

said plurality of ground and power contact pads for said semiconductor device includes a ring-shaped mutually insulated contact segments surrounding said chip area on said first surface; and said sharp-edged connectors further comprising saw-tooth shaped connectors sticking out from said heat spreader disposed on a surface area of said heat spreader facing said substrate surrounding said chip area of said substrate.

4. The electronic package of claim 1 wherein:

said plurality of connection means further includes a plurality of via connecting means penetrating from said first surface to said second surface through said substrate for connecting said power and ground contact pads on said first surface to said ground and power split planes on said second surface; and said heat spreader comprising a copper heat spreader and said sharp edged connectors comprising sharp-edged copper connectors.

5. The electronic package of claim 2 wherein:

said plurality of ground and power contact pads includes mutually insulated metallic contact segments on said first surface surrounding said cutoff cavity; and said substrate having substantially a same thickness as said semiconductor device.

6. The electronic package of claim 2 wherein:

said heat spreader further comprising a central recess surrounded by a heat-spreader recess wall and said central recess being substantially aligned with said cutoff cavity of said substrate for placing said semiconductor device therein; and said substrate having a thickness substantially less than said semiconductor device wherein said semiconductor device when placed in said central recess surrounded by said heat-spreader recess wall and by edges of said cutoff cavity, and said semiconductor device having a profile height substantial same as a profile height of said substrate placed over said heat spreader on a surface above said central recess.

7. The electronic package of claim 1 further comprising:

said adhesive layer comprising an electrically insulated heat conductive adhesive layer.

8. The electronic package of claim 1 further comprising:

said adhesive layer comprising an electrically insulated pre-preg adhesive layer.

9. The electronic package of claim 1 further comprising:

said adhesive layer comprising an electrically insulated pre-preg laminated adhesive layer.

10. The electronic package of claim 6 further comprising:

a plurality of next level contact means disposed on said first surface for providing next level electrical contacts;

a plurality of coplanar trace via connect on means penetrating from said first surface to said second surface through said substrate for connecting each of said second surface coplanar traces to one of said next level connection means on said first surface; and said semiconductor device having; a thickness of approximately 15 mils and said substrate having a thickness ranging from 1.0 to 10 mills and said heat spreader recess wall having a height ranging from about 5 mills to 15 mills for surrounding and placing said semiconductor device therein.

11. An electronic package assembly for containing and providing electrical contacts to a semiconductor device comprising:

a substrate including a chip placement area designated for disposing said semiconductor device, said substrate further including a first surface having a plurality of mutually insulated metallic contact segments as a ring-shape surrounding said chip area provided as ground and power contact pads for said semiconductor device wherein said mutually insulated contact segments having a gap of approximately 0.05 to 0.3 millimeters between each of said segments;

a plurality of mutually insulated split planes, provided as ground and power split planes on a second surface of said substrate for said semiconductor device wherein said mutually insulated split planes having a gap between every two adjacent split planes;

said chip area comprising a cutoff cavity for placing said semiconductor device therein, said cutoff cavity including a plurality of cutoff edges on perimeters of said cutoff cavity extending from said first surface to said second surface;

a plurality of next level contact means disposed on said first surface for providing next level contacts;

a plurality of connection means for electrically connecting each of said ground and power contact pads on said first surface to a corresponding mutually insulated ground and power contact pads on said first surface;

said plurality of connection means further includes a plurality of split conductive strips wrapping around cutoff edges for connecting said power and ground contact pads on said first surface to said ground and power split planes on said second surface;

a plurality of signal contact pads provided as signal contacts for said semiconductor device, disposed on said first surface away from said mutually insulated contact segments opposite said chip area;

a plurality of metal traces disposed on said first surface each connected to said signal contact pads extending away from said mutually insulated contact segments for electrically connecting to said next level contact means;

a plurality of second surface coplanar traces each connected to one of said signal contact pads disposed on said first surface through a via connection penetrating said substrate;

said mutually insulated split planes disposed on said second surface having a gap between two adjacent split planes and each of said second surface coplanar traces disposed in one of said gaps;

a plurality of split plane via connection means penetrating from said first surface to said second surface through said substrate for connecting each of said split planes on said second surface to one of said next level connection means on said first surface;

a plurality of coplanar trace via connection means penetrating from said first surface to said second surface through said substrate for connecting each of said second surface coplanar traces to one of said next level connection means on said first surface; and an electrically conductive heat spreader overlaying and attached to said second surface of said substrate via an adhesive layer wherein said heat spreader having sharp edged connectors sticking out of said heat spreader and penetrating said adhesive layer wherein said sharp-edged connectors are prearranged for contacting said ground split planes on said second surface of said substrate for providing a ground potential for said semiconductor device and for conducting a heat generated by said semiconductor device to said heat spread therethrough.

12. The electronic package of claim 11 wherein:

said next level contact means comprising a plurality of solder balls arranged as a ball grid array (BGA); and said sharp-edged connectors further comprising saw-tooth shaped connectors sticking out from said heat spreader disposed on a surface area of said heat spreader facing said substrate surrounding said chip area of said substrate.

13. The electronic package of claim 11 further comprising:

said heat spreader comprising a copper heat spreader and said sharp edged connectors comprising sharp-edged copper connectors; and an encapsulation means for covering and encapsulating said semiconductor device therein.

14. A heat spreader for an electronic package assembly for containing and providing electrical contacts to a semiconductor device; said heat spreader comprising:

sharp-edged connectors sticking out of said heat spreader wherein said sharp-edged connectors are prearranged for connecting a ground potential to said semiconductor device and for conducting a heat generated by said semiconductor device to said heat spread therethrough.

15. The heat spreader of claim 14 wherein:

said sharp edged connectors further comprising saw-tooth shaped connectors sticking out from said heat spreader disposed on a surface area of said heat spreader facing and surrounding said semiconductor device.

16. The heat spreader of claim 14 further comprising:

said heat spreader comprising a copper heat spreader and said sharp edged connectors comprising sharp edged copper connectors.

17. The heat spreader of claim 14 further comprising:

a central recess surrounded by a heat spreader recess wall provided for placing said semiconductor device therein with said recess wall surrounding said semiconductor device.

18. The heat spreader of claim 17 wherein:

said central recess surrounded by said heat-spreader recess wall having a recess depth substantially same as a thickness of said semiconductor device whereby said semiconductor device, when placed in said central recess, having about a same profile height as said central recess.

19. The heat spreader of claim 17 wherein:

said central recess surrounded by said heat-spreader recess wall having a recess depth slightly less than a thickness of said semiconductor device whereby said semiconductor device, when placed in said central recess, having a profile height slightly greater than a profile height of said central recess.

20. The heat spreader of claim 17 further comprising:

an adhesive layer disposed on a surface facing said semiconductor device provided for attaching to said semiconductor device and for attaching to a supporting substrate for packaging said semiconductor device wherein said sharp edged connectors penetrating said adhesive layer for contacting said supporting substrate for electrically connecting to said semiconductor device.

\* \* \* \* \*